US008356267B2

(12) United States Patent
Agarwal et al.

(10) Patent No.: US 8,356,267 B2
(45) Date of Patent: Jan. 15, 2013

(54) STATISTICAL METHOD FOR HIERARCHICALLY ROUTING LAYOUT UTILIZING FLAT ROUTE INFORMATION

(75) Inventors: Vikas Agarwal, Austin, TX (US); Yonatan Mittlefehldt, Austin, TX (US); Jafar Nahidi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/912,819

(22) Filed: Oct. 27, 2010

(65) Prior Publication Data

US 2012/0110536 A1    May 3, 2012

(51) Int. Cl.
*G06F 17/50* (2006.01)
(52) U.S. Cl. .................. 716/126; 716/129; 716/130
(58) Field of Classification Search ............. 716/126, 716/129, 130
See application file for complete search history.

(56) References Cited

U.S. PATENT DOCUMENTS

| | | | |
|---|---|---|---|
| 4,752,887 A | 6/1988 | Kuwahara | |
| 5,801,960 A | 9/1998 | Takano et al. | |
| 6,011,912 A | 1/2000 | Yui et al. | |
| 6,349,403 B1 | 2/2002 | Dutta et al. | |
| 6,460,169 B1 | 10/2002 | Camporese et al. | |
| 6,539,528 B2 | 3/2003 | Hwang et al. | |
| 6,898,774 B2 | 5/2005 | Alpert et al. | |
| 7,657,860 B1 | 2/2010 | Brashears et al. | |
| 7,681,169 B2 | 3/2010 | Berry et al. | |
| 7,949,984 B2 * | 5/2011 | Tanamoto et al. | ............ 716/124 |
| 2009/0210845 A1 | 8/2009 | Malgioglio et al. | |
| 2010/0058275 A1 | 3/2010 | Polomik et al. | |

* cited by examiner

*Primary Examiner* — Sun Lin
(74) *Attorney, Agent, or Firm* — Matthew W. Baca; Jack V. Musgrove

(57) ABSTRACT

An integrated circuit design is routed by first creating temporary routes in a flattened layout, generating blockage information for sub-blocks in the layout based on the temporary routes, and establishing a routing order for cells using a depth-first search. Cells in the original layout are then routed according to the routing order using the blockage information. The temporary routes are sorted into internal routes, terminal routes, and spanning routes. Blockage information for each sub-block includes a first cellview equal to the internal routes, a second cellview equal to the terminal routes plus the spanning routes, and a third cellview equal to the total tracks in the sub-block minus the first and second cellviews. The invention is particularly suited for routing a hierarchical integrated circuit design. By examining the complete hierarchy, the invention ensures that enough metal will be remaining at upper level sub-blocks to complete the routing automatically.

24 Claims, 7 Drawing Sheets

US 8,356,267 B2

STATISTICAL METHOD FOR HIERARCHICALLY ROUTING LAYOUT UTILIZING FLAT ROUTE INFORMATION

BACKGROUND OF THE INVENTION

1. Field of the Invention

The present invention generally relates to the design and manufacture of integrated circuits, and more particularly to a method of wire routing an integrated circuit design having multiple layers.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for vertical and/or horizontal routing: the polysilicon layer, and the metal-1, metal-2, and metal-3 layers.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The process of converting the specifications of an electrical circuit into such a layout is called the physical design.

Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete.

Routability is a key factor when performing circuit floorplanning or trying to close on timing via physical synthesis. A designer can expend considerable effort trying to get the design into a good state in terms of timing and signal integrity, only to subsequently find that it is unroutable. Ideally, the designer should be able to invoke a snapshot routability analysis that allows him or her to understand the routability issues involved from making floorplanning or optimization decisions.

Routing is further complicated in circuit designs having a building-block hierarchy, wherein the circuit can be considered logically as a top level having cells or nodes which are each constructed from sub-blocks, and the sub-blocks may themselves be constructed of smaller sub-blocks at lower levels. Designers currently run automatic routers at each level of the circuit hierarchy separately. While quicker than a complete manual layout, this approach still requires excessive time and preparation on the part of the designer, especially in setting up blockage patterns to prevent the router from using all available metal layers at lower level cells in the hierarchy. This approach also increases the runtime required by layout checking tools such as layout versus schematic, design rule checks, and methodology checks. These problem are exacerbated in particularly large designs.

It would, therefore, be desirable to devise an improved routing method to speed up turnaround time and decrease computational cost. It would be further advantageous if the method could take into consideration all levels of a hierarchical layout to ensure sufficient metal at upper level cells to complete the routes automatically.

SUMMARY OF THE INVENTION

It is therefore one object of the present invention to provide an improved method of routing an integrated circuit design.

It is another object of the present invention to provide such a method which is adapted to route a layout having hierarchical levels of cells or sub-blocks requiring interconnection.

It is yet another object of the present invention to provide such a hierarchical routing method which can determine how many routing tracks are available at lower level cells in order to have enough metal remaining at upper level cells to complete the routing automatically.

The foregoing objects are achieved in a method of routing an integrated circuit design, by flattening a 3D layout for the design into a 2D layout wherein cells in the 3D layout correspond to respective sub-blocks in the 2D layout, creating temporary routes in the 2D layout between selected sub-blocks according to desired interconnections between cells, generating blockage information for each sub-block based on the temporary routes, establishing a routing order for the cells using a depth-first search, and routing the cells in the 3D layout according to the routing order using the blockage information. The method can generate the blockage information by first sorting the temporary routes for each sub-block into one of three categories including internal routes, terminal routes, and spanning routes. Blockage information for a given sub-block may then be computed as a first cellview equal to the number of internal routes, a second cellview equal to the number of terminal routes plus the number of spanning routes, and a third cellview equal to the number of total tracks for the given sub-block minus the sum of the first and second cellviews. If any sub-block is identified as being unroutable using current blockage information, that blockage information is preferably modified by decrementing the third cellview for the identified sub-block and incrementing the first cellview, then re-routing the cells in the 3D layout according to the routing order beginning with the identified sub-block, using modified blockage information. This correction of unroutable sub-blocks is repeated iteratively until no sub-blocks remain which are unroutable.

The invention is particularly suited for routing an integrated circuit design having a hierarchical construction with at least one of the sub-blocks being a parent sub-block at an upper level composed of child sub-blocks at one or more lower levels. If the child sub-blocks include multiple instances of a single sub-block design, the method can assign the same cellviews to each of the multiple instances based on a lowest tally of tracks used. Use of the depth-first search ensures that the lowest level sub-blocks are routed first.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
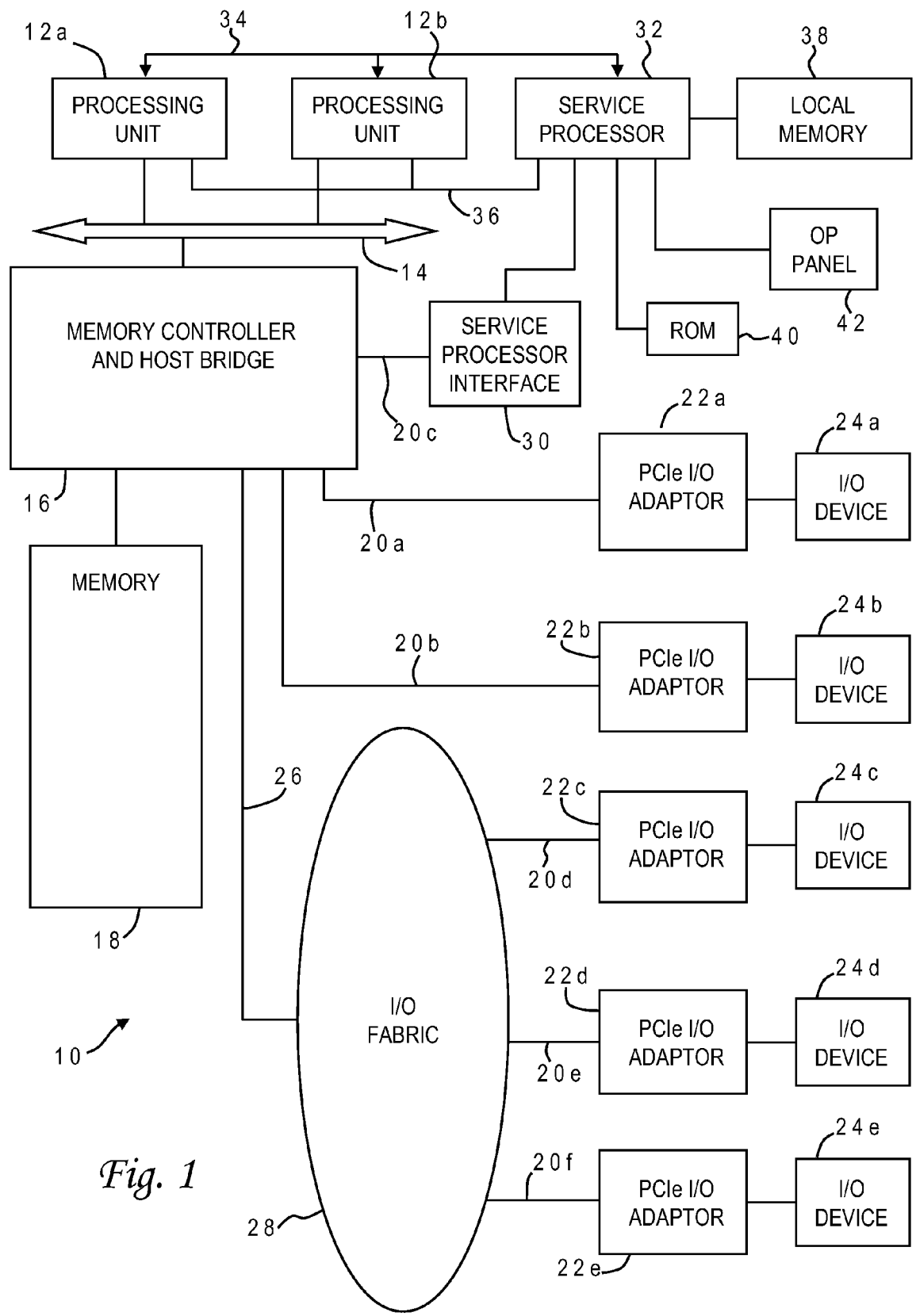
FIG. 1 is a block diagram of a computer system programmed to carry out integrated circuit routing in accordance with one implementation of the present invention.

With reference now to the figures, and in particular with reference to FIG. 1, there is depicted one embodiment 10 of a computer system in which the present invention may be implemented to carry out the design and routing of integrated circuits. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit routing application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such a computer-readable storage medium excludes transitory media such as propagating signals.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for a circuit design process that uses novel statistical techniques to manage wire routing. Accordingly, a program embodying the invention may include conventional aspects of various circuit design, placement and routing tools, and these details will become apparent to those skilled in the art upon reference to this disclosure.

Figure 2:
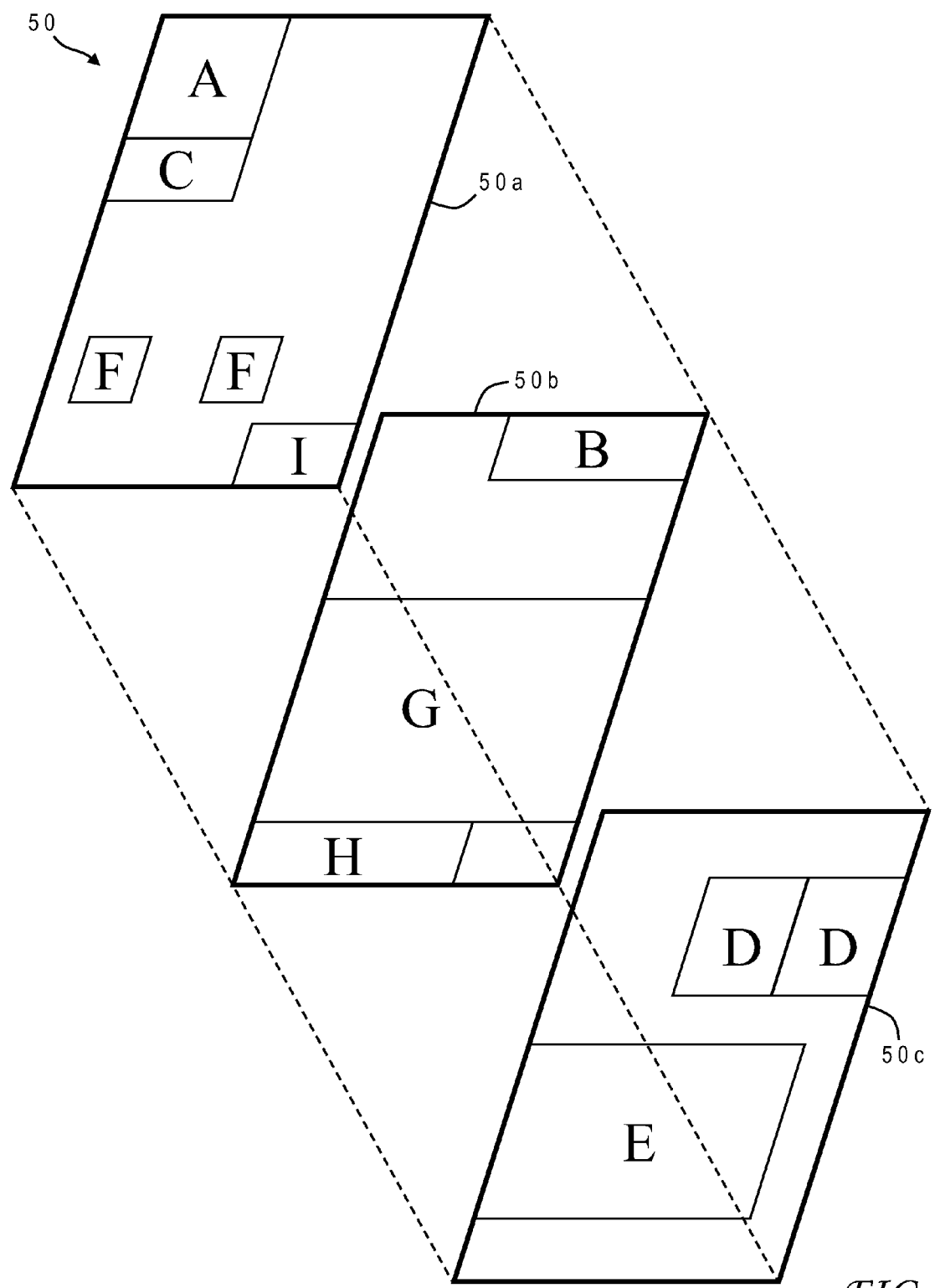
FIG. 2 is an exploded perspective view of a circuit layout in three dimensions to show cells at different layers.

Referring now to FIG. 2, there is depicted a simplified layout 50 of an integrated circuit design, or portion thereof such as a macro, which may be wire routed in accordance with the present invention. Layout 50 is a three-dimensional structure, with various logic cells or other circuit components laid out along generally parallel layers. In this example there are three layers 50a, 50b, 50c, although the invention may be practiced on layouts having more or less than three layers, and the layers are not necessarily equal in size, shape or thickness.

Also, the physical integrated circuit corresponding to layout 50 may include other layers (e.g., insulative) interposed between the depicted layers. Upper layer 50a includes cell A, cell C, two instances of cell F, and cell I. Middle layer 50b includes cell B, cell G, and cell H. Lower layer 50c includes two instances of cell D, and cell E. The depicted cells may be any type of logic structure, and are merely representative here of generalized components which require some electrical interconnection.

Figure 3A:
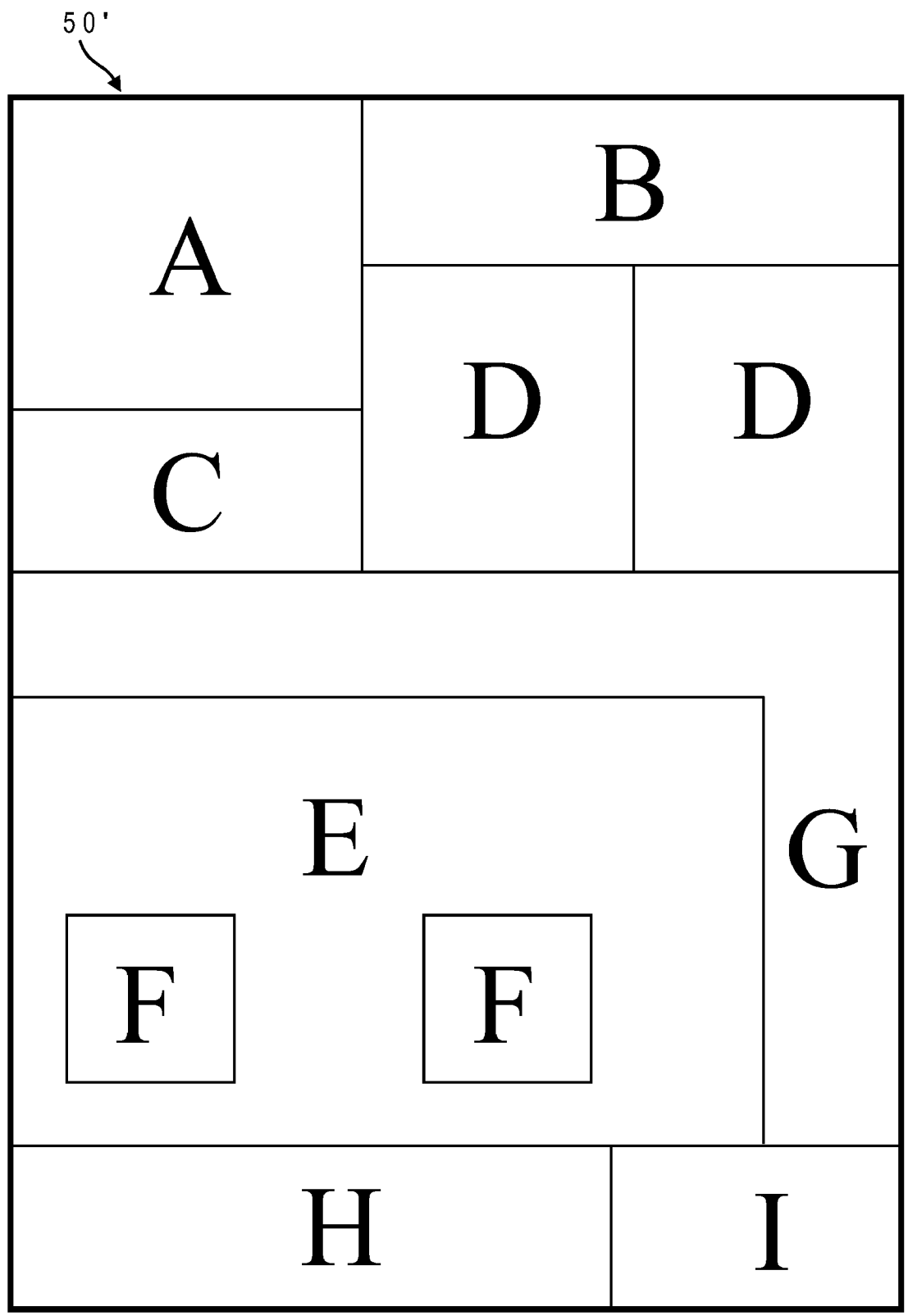
FIG. 3A is a plan view of a two-dimensional circuit layout corresponding to the three-dimensional layout of FIG. 2 which has been flattened in accordance with one embodiment of the present invention.

A program embodying the invention and running on computer system 10 can receive a description of the circuit layout, for example in the form of a netlist, which includes the locations of the cells in the various circuit layers. The program flattens the three-dimensional layout into a two-dimensional layout wherein each of the cells corresponds to a respective block or sub-block in the two-dimensional layout, as seen in FIG. 3A. The flattening process can simply strip the third dimension (corresponding to the different layers, or height) from the circuit description. Some of the sub-blocks in the resulting 2D layout 50' may be considered child sub-blocks that are contained within a parent sub-block; in this example the two instances of child sub-block F are contained within parent sub-block E, but sub-block E is further a child with respect to parent sub-block G. Sub-blocks in 2D layout 50' can also partially overlap although such an example is not shown for ease of illustration.

Figure 3B:
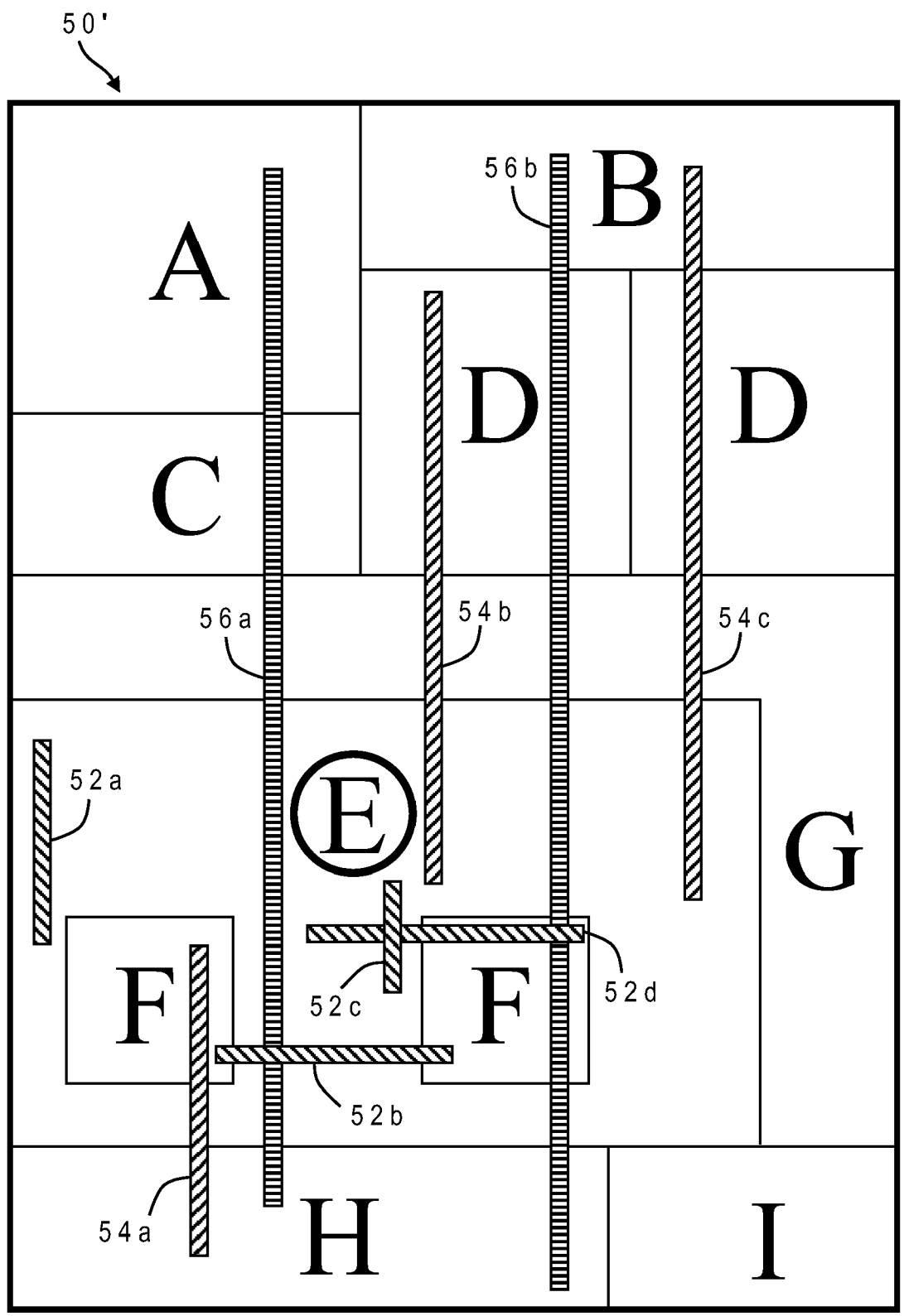
FIG. 3B is a plan view of the two-dimensional circuit layout of FIG. 3A but now showing, for a selected cell, temporary wiring routes which are classified in accordance with one implementation of the present invention as internal, terminal, or spanning.

Using 2D layout 50', computer system 10 creates temporary wire routes for the sub-blocks according to the desired interconnections between cells as specified in the circuit description. The temporary routes may be established using any conventional flat router (such as the "Floorplanning, Physical Synthesis, Place and Route" routers marketed by Cadence Design Systems, Inc., of San Jose, Calif.) applied to 2D layout 50'. FIG. 3B illustrates a set of those temporary routes 52, 54, 56 that overlie sub-block E. Computer system 10 can then generate blockage information for each sub-block based on the temporary routes. In the exemplary embodiment, the blockage information is based on three different (exclusive) categories of routes that impinge a given sub-block: pure internal routes (the route is completely contained within the sub-block); routes that have one and only one end terminating in the sub-block; and routes that span across the sub-block with no interconnections in the sub-block (neither end terminates in the sub-block). In FIG. 3B, sub-block E has four internal routes 52a, 52b, 52c, 52d, three terminal routes 54a, 54b, 54c, and two spanning routes 56a, 56b. Since both instances of sub-block F are completely internal to sub-block E, routes originating or terminating in these sub-blocks count as originating or terminating in the sub-block E. For each of these three categories of temporary routes, computer system 10 tallies the number of tracks used for each metal layer (M1, M2, M3, etc.) by the routes (horizontal and vertical). In order to ensure routability at higher hierarchical levels as explained further below, if there are multiple instances of the same cell/sub-block design (such as sub-block D or F in this example) the invention preferably uses the lowest tally of tracks used among the instances for each of those sub-blocks.

In the illustrative implementation, computer system 10 generates three cellviews for a given sub-block representing blockage information for that sub-block. The first cellview is the number of allowed tracks for routing the sub-block, determined by a count of its internal routes. The second cellview is the number of tracks used by surrounding sub-blocks, determined by the sum of the count of terminal routes and the count of spanning routes. The third cellview is the number of free or remaining tracks, determined by the total tracks in the sub-block (in all layers) excluding tracks assigned to the sub-block and any surrounding sub-block, i.e., the total number of tracks minus the sum of the first two cellviews.

Figure 4:
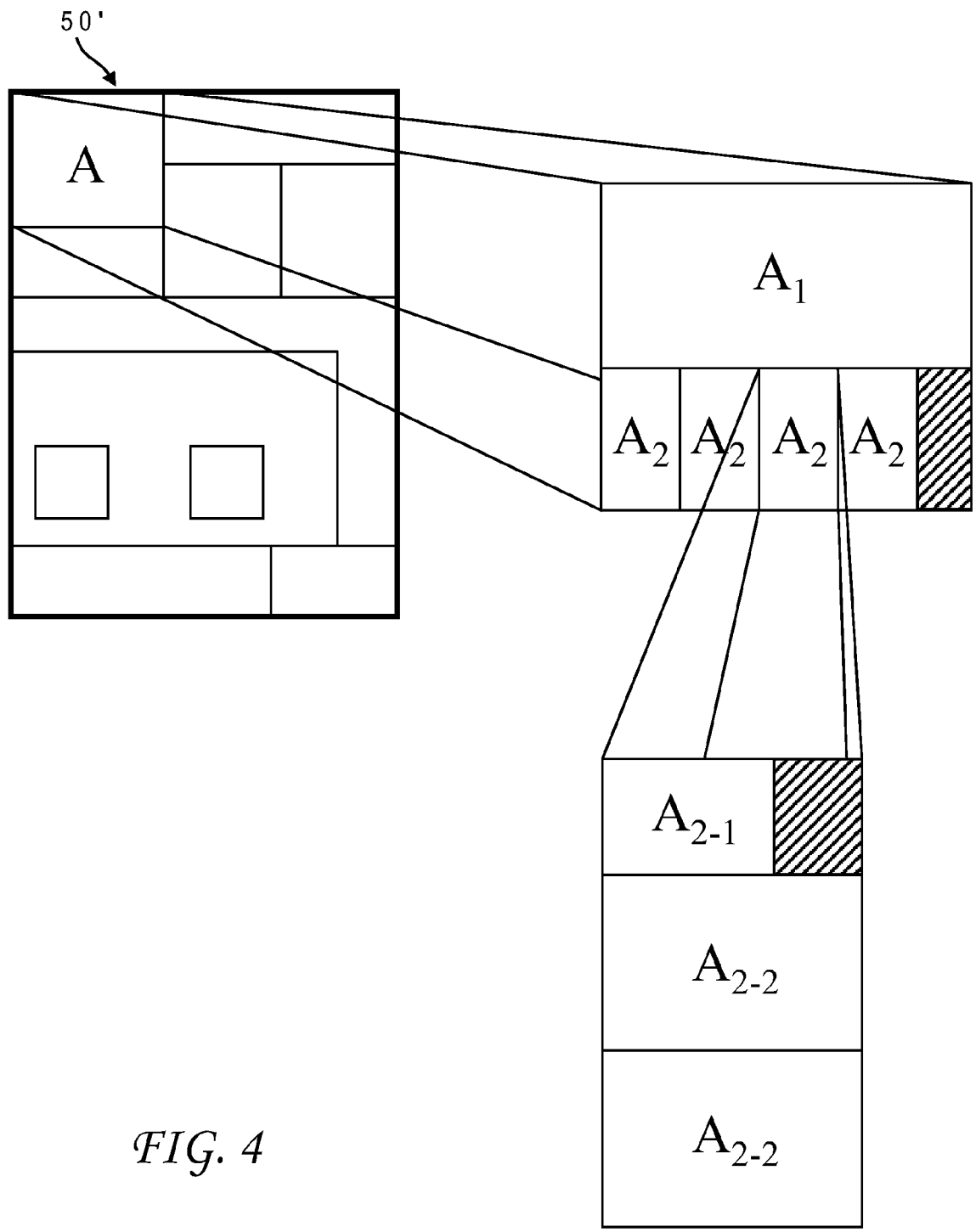
FIG. 4 is a pictorial representation of a hierarchical layout having cells or nodes composed of lower-level sub-blocks, which may be routed in accordance with one implementation of the present invention.

This blockage information can be generated for all sub-blocks at different levels of a hierarchical design. Hierarchical circuit designs have a building-block construction wherein the circuit can be considered logically as having cells or nodes at an upper level which are each composed of sub-blocks, and the sub-blocks may themselves be constructed of smaller sub-blocks at lower levels. FIG. 4 illustrates how the layout 50' might be deconstructed hierarchically for node A. In this diagram, it can be seen that node A is composed of five sub-blocks at the next lower level, including a larger sub-block $A_1$ and four instances of a smaller sub-block $A_2$. At a further lower level, each sub-block $A_2$ is composed of three other sub-blocks, including sub-block $A_{2-1}$ and two instances of sub-block $A_{2-2}$. In this example, sub-blocks $A_{2-1}$ and $A_{2-2}$ are at the lowest level, that is, they contain no other sub-blocks. In this regard, those skilled in the art will appreciate that these usages of the word "level" do not refer to the physical layers of the integrated circuit but rather only refer to the logical (organizational) construction of a cell or sub-block. Cell A is a parent of sub-blocks $A_1$ and $A_2$, and sub-block $A_2$ is further a parent of sub-blocks $A_{2-1}$ and $A_{2-2}$.

Figure 5:
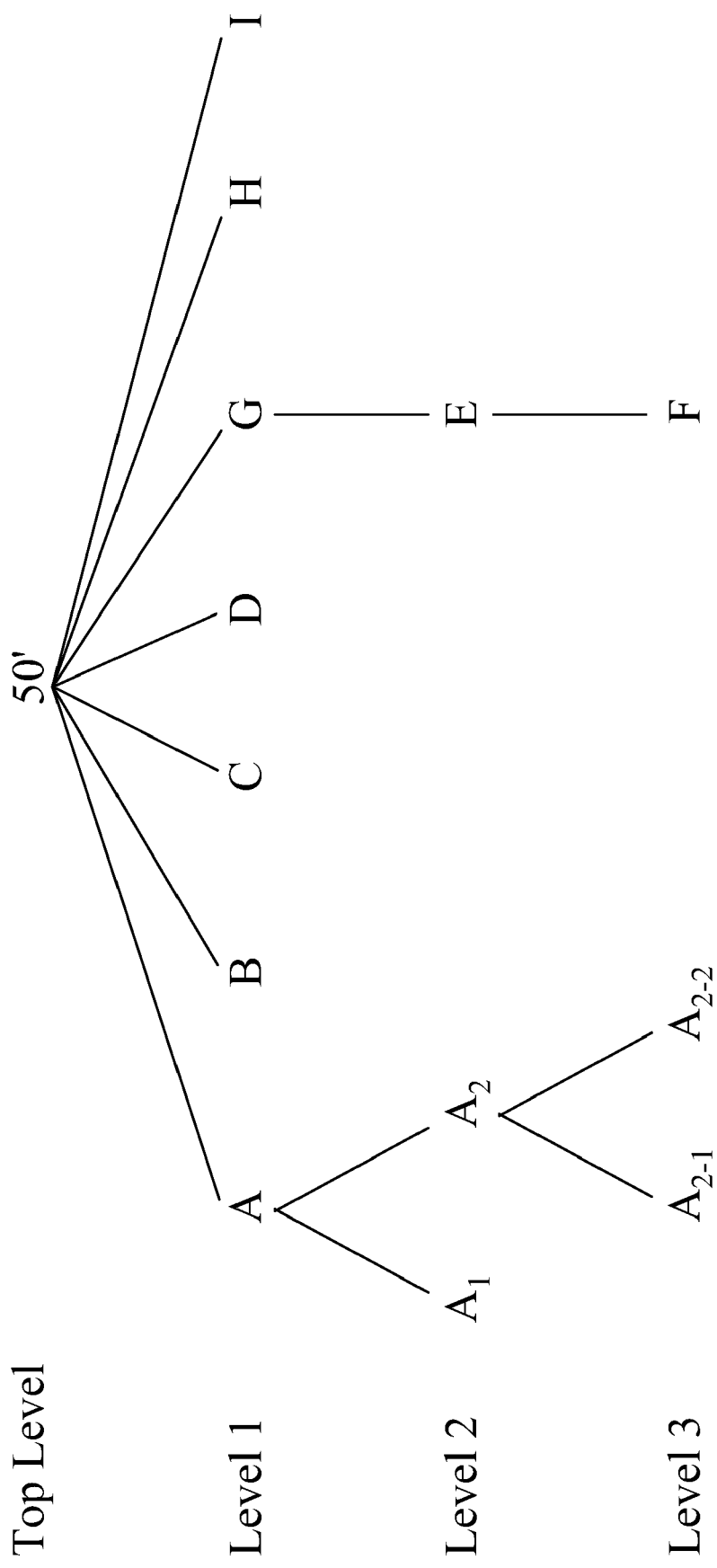
FIG. 5 is a tree diagram illustrating the hierarchical nature of the two-dimensional circuit layout of FIG. 3A with different levels in accordance with one implementation of the present invention.

FIG. 5 illustrates a tree structure that represents the hierarchical construction for the example layout 50' of FIG. 3A. Blockage information is accordingly generated for sub-blocks at each hierarchical level similar to that described in conjunction with FIG. 3B. The blockage information is preferably propagated using a non-recursive depth-first search (DFS), a known algorithm for traversing a tree structure. A DFS allows all nodes of a tree structure to be sorted such that all child (leaf) cells appear before their parents in the sort order, and the top level node appears last. For the tree in FIG. 5, and using a DFS that selects nodes from left to right by convention, the sort order is: $A_1, A_{2-1}, A_{2-2}, A_2, A, B, C, D, F, E, G, H, I$, 50'. Routing of the cells (in the 3D layout 50) then proceeds according to this routing order which ensures that the lowest level sub-blocks are routed first, so the router does not use more metal than it is afforded. Cells are routed using the previously generated blockage information, i.e., the first cellview indicates to the router the maximum number of tracks it is allowed to used for internally routing that sub-block, the second cellview indicates to the router how many tracks must be reserved for additional routing of surrounding sub-blocks, and the third cellview indicates to the router the maximum number of extra tracks that are available for routing other cells. Any conventional 3D routing tool may be used (such as the "Nanoroute" router also marketed by Cadence Design Systems, Inc., of San Jose, Calif.).

3D routing of the cells could theoretically be performed in parallel, but this approach becomes problematic if a cell is unroutable using current blockage information as some reconciliation would be required. Alternatively, the computer system can route a set of child cells in parallel, followed by higher level child cells in parallel. Applying this sorting method to the foregoing example, parallel routing could be accomplished in four routing steps:

1. $A_1, A_{2-1}, A_{2-2}$, B, C, D, F, H, I (all sub-blocks that have no children);
2. $A_2$, E (all sub-blocks that currently have no unrouted children);
3. A, G (remaining sub-blocks that currently have no unrouted children);
4. 50' (top level).

A tool embodying the present invention can keep track of all successfully routed sub-blocks, and flag any unsuccessfully routed sub-blocks as being unroutable using the current blockage information. Specific tracks (horizontal and vertical) used in a given cell can be determined by a separate algorithm, e.g., a simple assignment based on proximity to the left side (for vertical tracks) or bottom side (for horizontal tracks) of the cell, or more complicated algorithms which take into account cell types or alternate between opposite sides of a cell.

Figure 6:
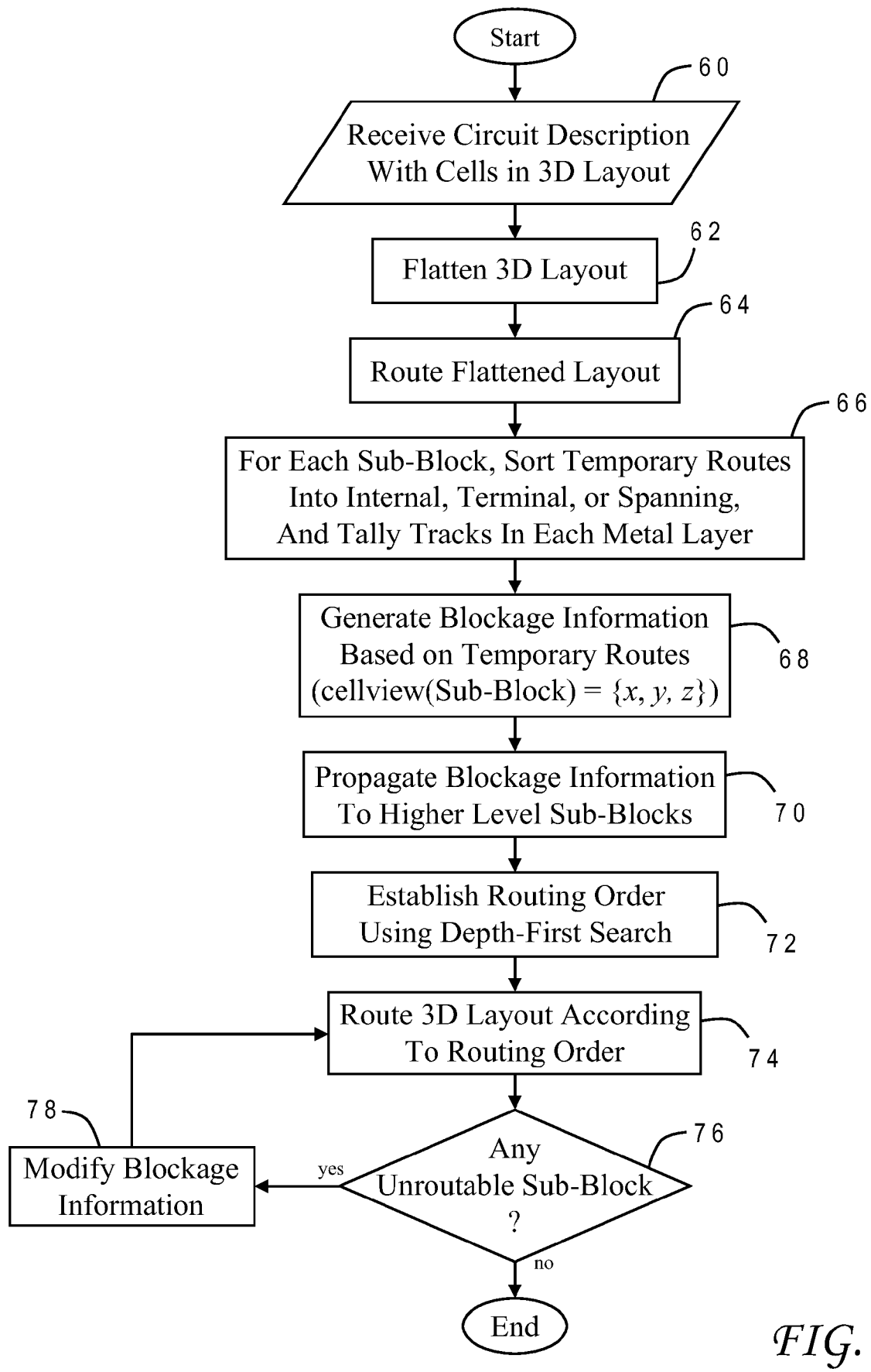
FIG. 6 is a chart illustrating the logical flow for routing an integrated circuit design in accordance with one implementation of the present invention.

The invention may be further understood with reference to the chart of FIG. 6 illustrating the logical flow for one implementation of the routing process. The process begins when the computer system receives the circuit description of the cells in the 3D layout (60). The 3D layout is then flattened into a 2D layout (62). The flattened layout is routed using any conventional routing technique (64). The computer system sort routes for each sub-block as internal, terminal, or spanning, and tallies tracks in each metal layer (66). Based on the temporary routes, the computer system builds blockage information in the form of the cellviews (68). The blockage information is propagated to higher levels (parent sub-blocks) in the hierarchical design (70). After the parent cellviews are complete, the routing order is established using the cellviews (72). The 3D layout is routed according to this order, for all sub-blocks (74). The computer system then determines whether any sub-blocks were flagged as unroutable (76). If so, blockage information is modified for those sub-blocks (78). Since the tool attempts to initially route using a minimum tally of available tracks at each level, for any failing sub-block a track from the third blockage cellview (free or remaining routes) can be transferred to the first blockage cellview (allowed or internal routes). The tool iteratively returns to box 74 to attempt to route from this point (the first failing sub-block in the established routing order for this iteration). Once the layout routing is clean, the process is complete. although the layout may be further analyzed by a layout checking tool.

Unlike current methods available to route a design, the statistical approach of present invention can automatically route a custom circuit at all levels of the hierarchy, allowing for a significantly quicker layout turnaround time. The invention takes into consideration the complete hierarchy in determining how many routing tracks may be used at lower level cells in order to ensure enough remaining metal at upper level cells to complete the routing automatically. By keeping the hierarchy intact, designers can more easily make timing and logic adjustments to the design as needed in future iterations of the design or as required by engineering change orders. Furthermore, the runtime required by layout checking tools is significantly decreased for a hierarchically routed design versus a flat routed design. This advantage is even more valuable with large designs, allowing companies to save considerable computational expense for layout resources.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A computer-implemented method of routing an integrated circuit design, comprising:
   receiving a description of the integrated circuit design which includes a plurality of cells located in different layers of a three-dimensional layout, by executing first instructions in a computer system;
   flattening the three-dimensional layout into a two-dimensional layout wherein each of the cells corresponds to a respective sub-block in the two-dimensional layout, by executing second instructions in the computer system;
   creating a plurality of temporary routes in the two-dimensional layout between selected sub-blocks according to desired interconnections between corresponding cells, by executing third instructions in the computer system;
   generating blockage information for each sub-block based on the temporary routes, by executing fourth instructions in the computer system; and
   routing the cells in the three-dimensional layout using the blockage information from corresponding sub-blocks, by executing sixth instructions in the computer system.

2. The method of claim 1 wherein said generating includes sorting the temporary routes for each sub-block into one of three categories including internal routes, terminal routes, and spanning routes.

3. The method of claim 2 wherein the blockage information for a given sub-block comprises:
   a first cellview equal to a number of internal routes for the given sub-block;
   a second cellview equal to a number of terminal routes plus a number of spanning routes for the given sub-block; and
   a third cellview equal to a number of total tracks for the given sub-block minus a sum of routes of the first and second cellviews for the given sub-block.

4. The method of claim 3 wherein said routing includes:
   identifying any sub-block which is unroutable using blockage information current in use;
   modifying the blockage information current in use by decrementing the third cellview for the identified sub-block and incrementing the first cellview for the identified sub-block;
   re-routing the cells in the three-dimensional layout using the modified blockage information; and
   iteratively repeating said identifying, modifying, and re-routing until no sub-blocks remain which are unroutable.

5. The method of claim 3 wherein the integrated circuit design has a hierarchical construction with at least one of the sub-blocks being a parent sub-block composed of one or more child sub-blocks, and blockage information is generated for each child sub-block and the parent sub-block.

6. The method of claim 5 wherein the child sub-blocks include multiple instances of a single sub-block design, and said generating assigns the same cellviews to each of the multiple instances based on a lowest tally of tracks used for the multiple instances.

7. The method of claim 5, further comprising establishing a routing order for routing the cells wherein the routing order places the parent sub-block after the child sub-blocks, and the cells in the three-dimensional layout are routed according to the routing order.

8. A computer system comprising:
   one or more processors which process program instructions;
   a memory device connected to said one or more processors; and
   program instructions residing in said memory device for routing an integrated circuit design by receiving a description of the integrated circuit design which includes a plurality of cells located in different layers of a three-dimensional layout, flattening the three-dimensional layout into a two-dimensional layout wherein each of the cells corresponds to a respective sub-block in the two-dimensional layout, creating a plurality of temporary routes in the two-dimensional layout between selected sub-blocks according to desired interconnections between corresponding cells, generating blockage information for each sub-block based on the temporary routes, and routing the cells in the three-dimensional layout using the blockage information from corresponding sub-blocks.

9. The computer system of claim 8 wherein the generating includes sorting the temporary routes for each sub-block into one of three categories including internal routes, terminal routes, and spanning routes.

10. The computer system of claim 9 wherein the blockage information for a given sub-block comprises:
   a first cellview equal to a number of internal routes for the given sub-block;
   a second cellview equal to a number of terminal routes plus a number of spanning routes for the given sub-block; and
   a third cellview equal to a number of total tracks for the given sub-block minus a sum of routes of the first and second cellviews for the given sub-block.

11. The computer system of claim 10 wherein the routing includes:
   identifying any sub-block which is unroutable using blockage information current in use;
   modifying the blockage information current in use by decrementing the third cellview for the identified sub-block and incrementing the first cellview for the identified sub-block;
   re-routing the cells in the three-dimensional layout using the modified blockage information; and
   iteratively repeating the identifying, modifying, and re-routing until no sub-blocks remain which are unroutable.

12. The computer system of claim 10 wherein the integrated circuit design has a hierarchical construction with at least one of the sub-blocks being a parent sub-block composed of one or more child sub-blocks, and blockage information is generated for each child sub-block and the parent sub-block.

13. The computer system of claim 12 wherein the child sub-blocks include multiple instances of a single sub-block design, and the generating assigns the same cellviews to each of the multiple instances based on a lowest tally of tracks used for the multiple instances.

14. The computer system of claim 12 wherein said program instructions further establish a routing order for routing the cells that places the parent sub-block after the child sub-blocks, and the cells in the three-dimensional layout are routed according to the routing order.

15. A computer program product comprising:
   a computer-readable storage medium; and
   program instructions residing in said storage medium for causing a computer system to perform routing of an integrated circuit design by receiving a description of the integrated circuit design which includes a plurality of cells located in different layers of a three-dimensional layout, flattening the three-dimensional layout into a two-dimensional layout wherein each of the cells corresponds to a respective sub-block in the two-dimensional layout, creating a plurality of temporary routes in the two-dimensional layout between selected sub-blocks according to desired interconnections between corresponding cells, generating blockage information for each sub-block based on the temporary routes, and routing the cells in the three-dimensional layout using the blockage information from corresponding sub-blocks.

16. The computer program product of claim 15 wherein the generating includes sorting the temporary routes for each sub-block into one of three categories including internal routes, terminal routes, and spanning routes.

17. The computer program product of claim 16 wherein the blockage information for a given sub-block comprises:
   a first cellview equal to a number of internal routes for the given sub-block;
   a second cellview equal to a number of terminal routes plus a number of spanning routes for the given sub-block; and
   a third cellview equal to a number of total tracks for the given sub-block minus a sum of routes of the first and second cellviews for the given sub-block.

18. The computer program product of claim 17 wherein the routing includes:
   identifying any sub-block which is unroutable using blockage information current in use;
   modifying the blockage information current in use by decrementing the third cellview for the identified sub-block and incrementing the first cellview for the identified sub-block;
   re-routing the cells in the three-dimensional layout using the modified blockage information; and
   iteratively repeating the identifying, modifying, and re-routing until no sub-blocks remain which are unroutable.

19. The computer program product of claim 17 wherein the integrated circuit design has a hierarchical construction with at least one of the sub-blocks being a parent sub-block composed of one or more child sub-blocks, and blockage information is generated for each child sub-block and the parent sub-block.

20. The computer program product of claim 19 wherein the child sub-blocks include multiple instances of a single sub-block design, and the generating assigns the same cellviews to each of the multiple instances based on a lowest tally of tracks used for the multiple instances.

21. The computer program product of claim 19 wherein said program instructions further establish a routing order for routing the cells that places the parent sub-block after the child sub-blocks, and the cells in the three-dimensional layout are routed according to the routing order.

22. A computer-implemented method for hierarchically routing an integrated circuit design, comprising:
   receiving a description of the integrated circuit design which includes a plurality of cells located in different layers of a three-dimensional layout, by executing first instructions in a computer system;
   flattening the three-dimensional layout into a two-dimensional layout having sub-blocks corresponding to the cells wherein at least one of the sub-blocks is a parent sub-block at an upper hierarchical level composed of a plurality of child sub-blocks at one or more lower hierarchical levels, by executing second instructions in the computer system;
   creating a plurality of temporary routes in the two-dimensional layout between selected sub-blocks according to desired interconnections between corresponding cells, by executing third instructions in the computer system;
   generating blockage information for each sub-block based on the temporary routes including the child sub-blocks and the parent sub-block, by executing fourth instructions in the computer system;
   establishing a routing order for routing the cells that places the parent sub-block after the child sub-blocks, by executing fifth instructions in the computer system; and
   routing the cells in the three-dimensional layout according to the routing order using the blockage information from corresponding sub-blocks, by executing sixth instructions in the computer system.

23. The method of claim 22 wherein the routing order is established using a depth-first search.

24. The method of claim 22 wherein:
said generating includes sorting the temporary routes for each sub-block into exclusive categories including internal routes, terminal routes, and spanning routes;
the blockage information for a given sub-block comprises a first cellview equal to a number of internal routes for the given sub-block, a second cellview equal to a number of terminal routes plus a number of spanning routes for the given sub-block, and a third cellview equal to a number of total tracks for the given sub-block minus a sum of routes of the first and second cellviews for the given sub-block.

* * * * *